United States Patent
Norland et al.

(10) Patent No.: US 6,869,291 B2
(45) Date of Patent: Mar. 22, 2005

(54) ELECTRICAL CONNECTOR HAVING IMPROVED ELASTOMERIC CONTACT PRESSURE PAD

(75) Inventors: Raymond Jose Norland, Cypress, CA (US); Israel V. Castaneda, Huntington Beach, CA (US); Blake F. Woith, Santa Ana, CA (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/659,488

(22) Filed: Sep. 10, 2003

(65) Prior Publication Data

US 2004/0058565 A1 Mar. 25, 2004

Related U.S. Application Data

(60) Provisional application No. 60/411,916, filed on Sep. 19, 2002.

(51) Int. Cl.[7] .................................................. H01R 9/09
(52) U.S. Cl. ...................................................... 439/67
(58) Field of Search ............................... 439/77, 65, 67, 439/329, 493

(56) References Cited

U.S. PATENT DOCUMENTS

| 4,798,541 | A | * | 1/1989 | Porter ........................ 439/67 |
| 4,993,958 | A | * | 2/1991 | Trobough et al. .............. 439/67 |
| 5,160,269 | A | * | 11/1992 | Fox et al. ...................... 439/67 |
| 5,197,184 | A | | 3/1993 | Crumly et al. |
| 5,207,887 | A | | 5/1993 | Crumly et al. |
| 5,295,838 | A | | 3/1994 | Walen et al. |
| 6,520,789 | B2 | | 2/2003 | Daugherty, Jr. et al. .... 439/329 |
| 6,533,588 | B1 | | 3/2003 | Woith et al. .................. 439/67 |
| 6,614,659 | B2 | | 9/2003 | Feigenbaum et al. ..... 439/66 X |

* cited by examiner

Primary Examiner—Renee Luebke
(74) Attorney, Agent, or Firm—David P. Wood

(57) ABSTRACT

A high-density electrical connector includes a rigid member having an array of electrical contact pads, a clamp housing attached to the rigid member, and a flexible printed circuit. The flexible printed circuit has a back surface, a front surface and a contact portion having a matching array of electrical contacts protruding outwardly of the front surface of the flexible printed circuit. The contact portion is disposed between the clamp housing and the rigid member and an elastomeric contact pressure pad is disposed between the clamp housing and the flexible printed circuit pressing each of the protruding electrical contacts into one of the electrical contact pads. The elastomeric pad is shaped and resiliently deformed by the clamp housing to provide a substantially uniform contact pressure to the array of electrical contacts.

9 Claims, 3 Drawing Sheets

ELECTRICAL CONNECTOR HAVING IMPROVED ELASTOMERIC CONTACT PRESSURE PAD

RELATED PATENT APPLICATION

This patent application claims benefit of the filing date of U.S. Provisional patent application No. 60/411,916 filed Sep. 19, 2002.

FIELD OF INVENTION

The present invention relates to electrical connectors and more particularly to electrical connectors employing an elastomeric contact pressure pad to provide good electrical contact pressure between bump or gold dot contacts and their cooperating electrical contact pads.

BACKGROUND OF THE INVENTION

A flexible printed circuit having bump contacts or gold dot contacts is already known from U.S. Pat. Nos. 5,197,184 and 5,207,887 granted to William R. Crumly et al Mar. 30, 1993 and May 4, 1993 respectively.

An electrical connector employing such a flexible printed circuit is also known from U.S. Pat. No. 5,295,838 granted to James R. Whalen et al Mar. 22, 1994. In this electrical connector, the bump contacts or gold dot contacts of the flexible printed circuit are pressed against mating sets of contacts carried by a rigid circuit board by a clamping structure that is bolted to the rigid circuit board. The clamping structure includes an elongated pressure bar that engages the back side of the flexible printed circuit. The pressure bar has a plurality of blind holes aligned with the respective contacts of the flexible printed circuit. Each blind hole receives a compression spring that is compressed between the pressure bar and a pressure bar housing so that the pressure bar presses the electrical contacts of the flexible printed circuit against the mating set of electrical contact pads carried by the rigid circuit board.

"High-density" electrical connectors having raised bump or gold dot electrical contacts on one connector element adjacent a second connector element with electrical contact pads generally require a mechanism for providing compressive force urging the connector elements together to assure that electrical contact is maintained. Among the most successful prior approaches is an approach involving the provision of a spring-type element for maintaining pressure across the contact elements, particularly in combination with some external clamping arrangement as shown for example in U.S. Pat. No. 5,295,838. (Any electrical connector in which the pitch of the electrical contacts is between about 0.020 and about 0.050 mils is generally recognized as a high density electrical connector.)

Recently, the use of an elastomeric pad or layer having individual ridges aligned with each row of raised bumps has been adopted and widely accepted in the high-density connector field. By carefully aligning the ribs with the rows of bumps, reliable engagement force can be assured. A known 175 way "high density" electrical connector 1 of this type employing a flexible printed circuit 2 is illustrated in FIGS. 1 and 2. The flexible printed circuit 2 shown in FIG. 1 thus has 175 closely spaced contacts arranged rank and file with 7 rows of contacts each containing 25 contacts. In this high density electrical connector, an elongated elastomeric contact pressure pad 3 engages the flexible printed circuit to press the contacts 4 of the flexible printed circuit against the mating set of contact pads 5 carried by a rigid printed circuit board 6. The elastomeric pad 3 has twenty-five spaced ribs 7 that extend laterally across the elastomeric pad. Each rib 7 is aligned with a short transverse row of contacts and engages the back side of the flexible printed circuit pushing the contacts 4 against the contact pads 5 when the flexible printed circuit 2 and the elastomeric pad 3 are clamped between a clamp housing 8 and the printed circuit board 6. Clamp housing 8 is adjusted by machine screws 9 that screw into attachment portions of the clamp housing 8. Screws 9 pass through aligned locator holes in a stiffener bar 9a, printed circuit board 6 and flexible printed circuit 2 to align contacts 4 with contact pads 5 and the ribs 7 with the short rows of contacts 4.

SUMMARY OF THE INVENTION

This invention provides an electrical connector that has an improved elastomeric contact pressure pad that has been developed specifically for high-density electrical connectors having bump or gold dot type electrical contacts engaging adjacent electrical contact pads.

Particular advantage is provided in bump or gold dot contact electrical connectors where it is desired to provide uniform contact pressure across the array of bump or gold dot contacts.

The elastomeric contact pressure pad preferably includes an arcuate surface on one side engaging the flexible printed circuit providing good contact engagement force without the need for strict alignment of the ribs with the rows of bump-type electrical contacts as in the prior art elastomeric pad discussed above in connection with FIGS. 1 and 2 of the patent drawing.

On the opposite side of the elastomeric contact pressure pad, it is also preferable to provide longitudinal ribs having a tendency to increase the forces along the longitudinal rows of bump-type contacts. By placing the longitudinal ribs on the opposite side of the elastomeric pad, greater resiliency is additionally imparted to the overall compression arrangement accommodating a higher degree of shock and/or vibration without causing the electrical contacts to lose their alignment with the electrical contact pads to which electrical connection is desired.

DETAILED DESCRIPTION OF PREFERRED EMBODIMENT OF THE INVENTION

Referring now to FIGS. 3 through 7, a high-density electrical connector 10 incorporating the invention is disclosed. Electrical connector 10 comprises a flexible printed circuit 12 for making an electrical interconnection between an upper printed circuit board 14 and a lower printed circuit board 16.

Figure 3:
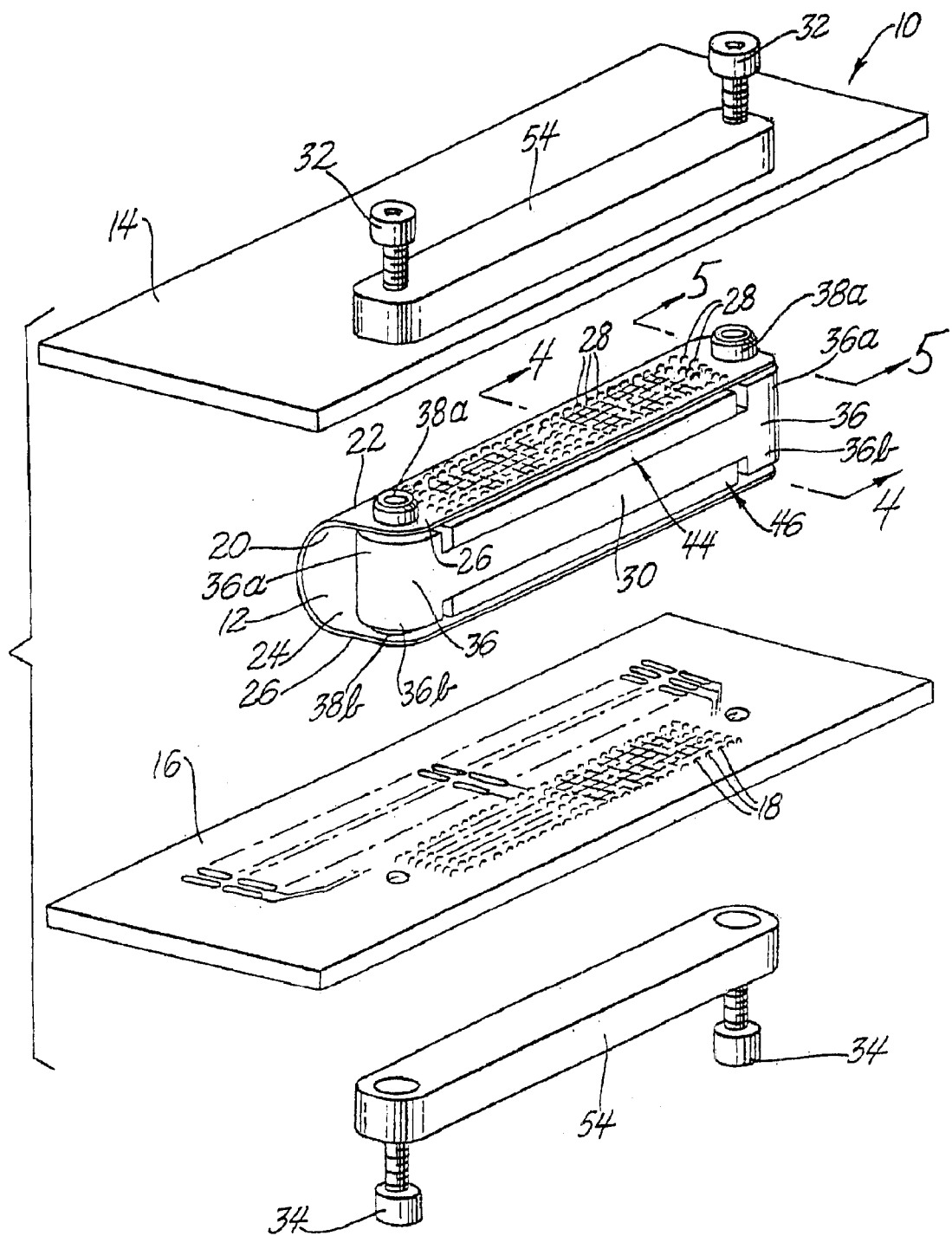
FIG. 3 is an exploded perspective view of an electrical connector according to the invention.

Printed circuit boards are well known in the art and consequently the printed circuit boards 14 and 16 are not shown in detail. Briefly, the printed circuit boards 14 and 16 comprise a rigid member or substrate having a pattern of electrical traces that form electrical circuits and electrical contact pads for making electrical connections to the electrical circuits. In this particular instance, the electrical contact pads are arranged in an elongate array of electrical contact pads as best shown in FIG. 3 by the electrical contact pads 18 on the upper surface of lower printed circuit board 16. Upper printed circuit board 14 has a similar array of electrical contact pads on its lower surface (not shown).

Flexible printed circuits are also well known in the art and consequently, the flexible printed circuit 12 is not shown in detail. Briefly, flexible printed circuit 12 comprises a flexible ribbon insulator 20 having a pattern of electrical traces that form electrical circuits and electrical contact pads for making electrical connections to the electrical circuits. In this particular instance, the flexible ribbon insulator 20 has a front surface 22, a back surface 24 and a contact portion 26 at each end. Each contact portion 26 has an elongate array of electrical contacts 28 that protrude outwardly of the front surface 22 of the flexible ribbon insulator 20, which may be a single layer or a multiple layer laminate as is well known in the art. The protruding electrical contacts 28 may be bump contacts or gold dot contacts that are described above in the background of the invention.

The two arrays of contacts 28 may be identical or the arrays may be different. In any event, the elongate array of electrical contacts 28 at the upper end of flexible printed circuit 12 always matches the elongate array of electrical contact pads (not shown) on the bottom surface of upper printed circuit board 14. On the other hand, the elongate array of electrical contacts 28 at the lower end of flexible printed circuit (not shown) always matches the elongate array of electrical contact pads 18 on the upper surface of the lower printed circuit board 16.

Figure 4:
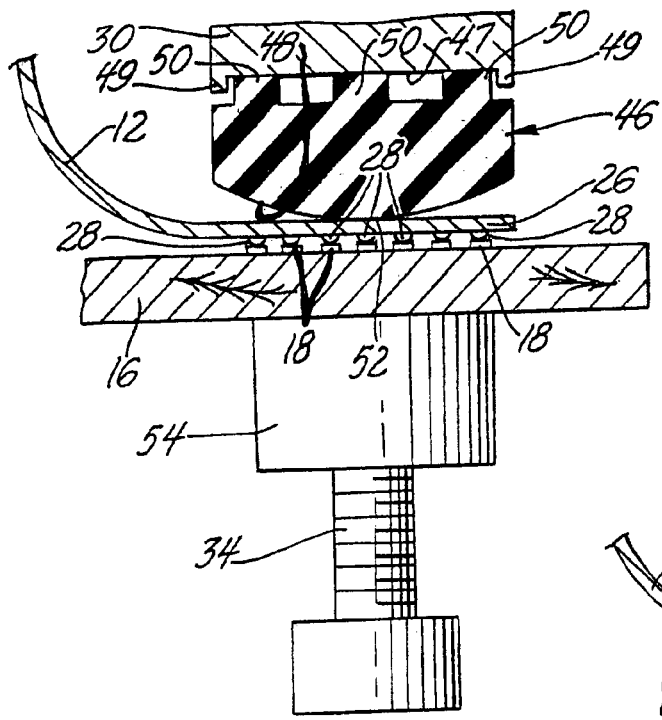
FIG. 4 is a cross sectional view of the electrical connector of FIG. 3 taken substantially along the line 4—4 of FIG. 3 looking in the direction of the arrows.
Figure 5:
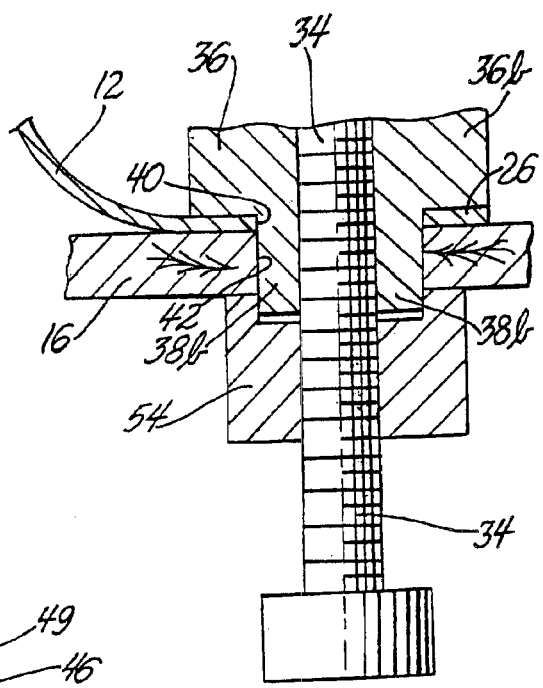
FIG. 5 is a cross sectional view of the electrical connector of FIG. 3 taken substantially along the line 5—5 of FIG. 3 looking in the direction of the arrows.
Figure 6:
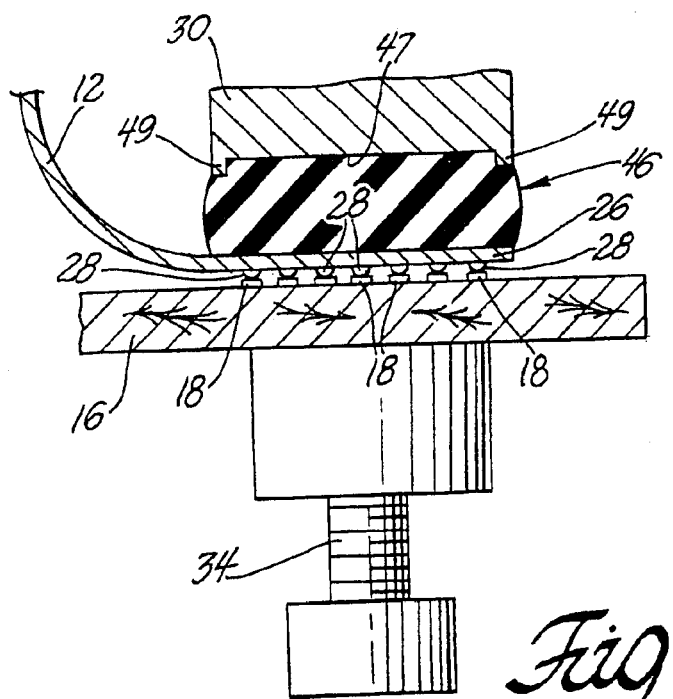
FIG. 6 is a cross sectional view of the electrical connector of FIG. 3 similar to FIG. 4 taken after assembly is completed.

Electrical connector 10 includes an adjustable clamp housing 30 that is attached to the rigid printed circuit boards 14 and 16 individually by two sets of machine screws 32 and 34. Clamp housing 30 has attachment portions 36 at each end that project vertically in each direction to form upper and lower attachment portions 36a and 36b for the respective upper and lower printed circuit boards 14 and 16. The attachment portions 36a and 36b have threaded bores to receive machine screws 32 and 34 respectively and concentric projecting bosses 38a and 38b at the outer ends of the threaded bores. As best shown in FIG. 5 these bosses project through locating holes 40 in the contact portions 26 of the flexible printed circuit 12 and through locating holes 42 in the upper and lower printed circuit boards 14 and 16. Thus the projecting bosses 38a and 38b align the elongate arrays of electrical contacts 28 of the flexible printed circuit 12 with the respective elongate arrays of electrical contact pads 18 of the printed circuit boards 14 and 16 when the contact portions 26 are disposed between the clamp housing 30 and the respective printed circuit boards 14 and 16 as best shown in FIGS. 4 and 6.

Electrical connector 10 further includes an upper elongate elastomeric contact pressure pad 44 and a lower elongate elastomeric contact pressure pad 46 which are made for example of silicone rubber. Upper pad 44 is disposed between the upper side wall of the clamp housing 30 (between attachment portions 36a) and the contact portion 26 at the upper end of the flexible printed circuit 12 pressing each of the electrical contacts 28 into one of the electrical contact pads 18 of upper printed circuit board 14. Narrow ribs are preferably provided at the longer ends of the upper side wall to locate upper pad 44. Lower pad 46 is disposed in a similar manner between the lower side wall 47 of the clamp housing 30 and the contact portion 26 at the lower end of the flexible printed circuit 12 pressing each of the electrical contacts 28 into one of the electrical contact pads 18 of lower printed circuit board 16. Narrow ribs 49 are also preferably provided at the longer ends of lower side wall 47 to locate elastomeric pad 46.

Figure 7:
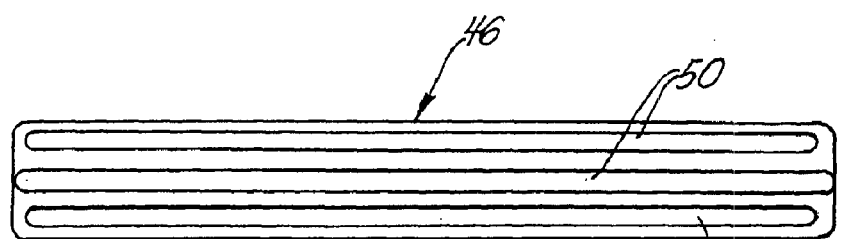
FIG. 7 is plan view of the elastomeric contact pressure pad of the invention.

The typical elongate elastomeric pad 46 has an arcuate surface 48 on one side engaging the back surface 24 of the flexible insulator ribbon 20 of the flexible printed circuit 12 and a plurality of longitudinal ribs 50 on an opposite side engaging the lower side wall 47 of clamp housing 30. The longitudinal ribs 50 are substantially parallel and the arcuate surface 48 has an apex 52 that is substantially parallel to the longitudinal ribs 50 as best shown in FIGS. 4 and 7. The upper elastomeric pad 44 has the same shape.

Electrical connector 10 is assembled by abutting the longitudinal ribs 50 of elastomeric pad 46 with the lower side wall 47 of clamp housing 30 between attachment portions 36b with the elastomeric pad preferably being located by the narrow ribs 49. The lower contact portion 26 of flexible printed circuit 12 is then located against the arcuate surface 48 of pad 46 by bosses 38b engaging in locating holes 40. The lower printed circuit board 16 is then located against the lower contact portion 26 by bosses 38b engaging in its locating holes 42. Machine screws 34 are then screwed into the threaded bores of the lower attachment portions 36b of clamp housing 30 until the elastomeric pad 46 and the contact portion 26 of the flexible printed circuit 12 are clamped securely between clamp housing 30 and lower printed circuit board 16. Electrical connector 10 may also include an optional stiffener bar 54 to enhance the rigidity of the lower printed circuit board 16 in the area behind the elongate array of electrical contact pads.

The position of the clamp housing 30 with respect to the lower printed circuit board 16 is adjusted by turning machine screws 34. The adjustment is preferably such that the elastomeric pad 46 is resiliently deformed by the clamp housing 30 to provide a substantially uniform contact pressure to the elongate array of electrical contacts 28 of the lower contact portion 26 that engages the matching elongate array of electrical contact pads 18 carried by the lower printed circuit board 16. This condition is essentially achieved when the arcuate surface 48 is flattened and the longitudinal ribs 50 are flattened whereby the opposite sides of the pad 46 are substantially planar and parallel to each other as best shown in FIG. 6. In this regard it should be noted that the outer longitudinal ribs 50 are initially inside the narrow locating ribs 49 of clamp housing 30 as best shown in FIG. 4.

The upper elastomeric pad 44, upper contact portion 26 and the upper printed circuit board 14 are assembled and attached in a like manner by machine screws 32. Machine screws 32 are also used to adjust the position of the upper printed circuit board 14 with respect to the clamp housing 30 so that elastomeric pad 44 is resiliently deformed by the clamp housing 30 to provide a substantially uniform contact pressure to the elongate array of electrical contacts 28 of the upper contact portion 26 that engage the matching elongate array of electrical contact pads carried by the upper printed circuit board 14.

Figure 1:
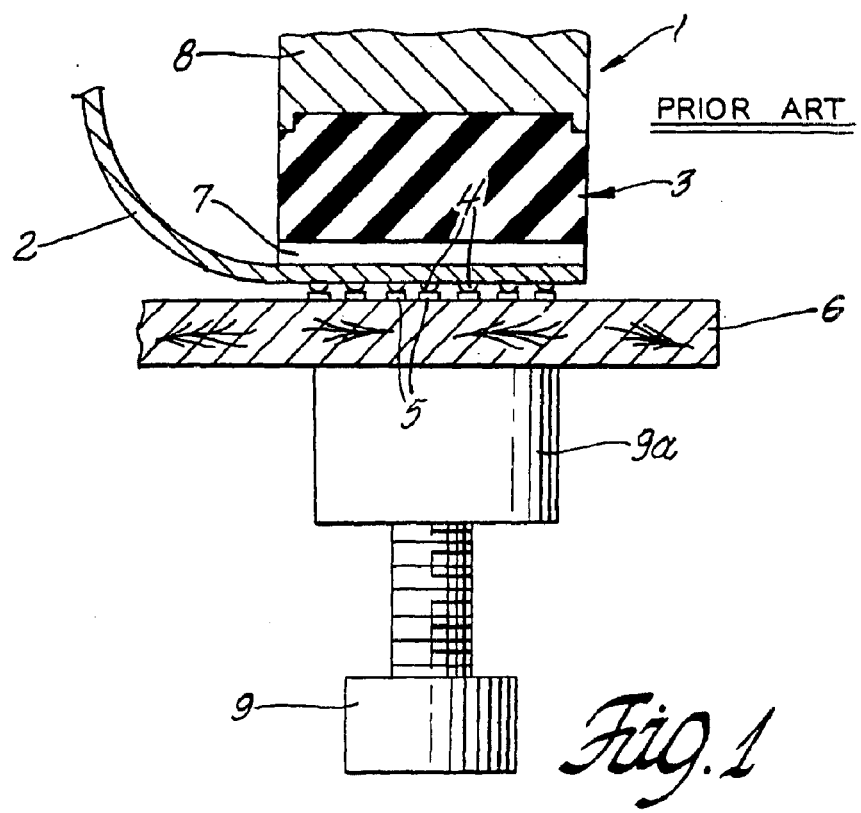
FIG. 1 is a cross sectional view of a prior art high density electrical connector employing a flexible printed circuit.
Figure 2:
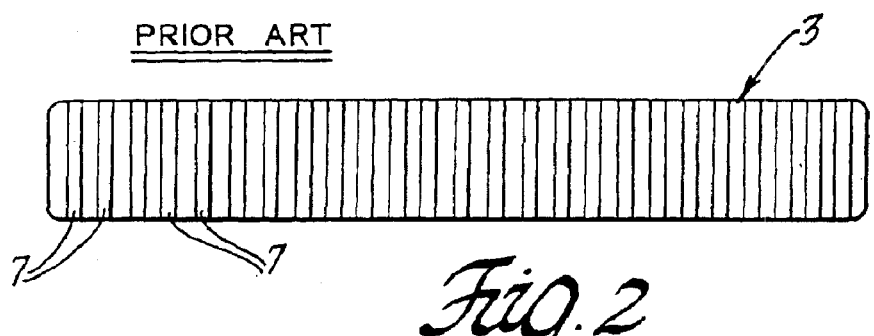
FIG. 2 is a plan view of the prior art elastomeric contact pressure pad that is used in the electrical connector of FIG. 1.

It should be noted that the flexible printed circuit engaging surface of elastomeric pad 44 or 46 of the invention has an arcuate shape to allow localized force to be distributed down the center portion, at the same time allowing even distribution of forces to be maintained towards the long outer edges of the elastomeric pad, creating an excellent overall electrical connection of the elongated array of contacts to the elongated array of electrical contact pads. The arcuate shape of the elastomeric flexible printed circuit engaging surface allows uniform pressure distribution along the overall region of the perimeter, which allows the flexible printed circuit to maintain an electrical connection whereas the elastomeric pad 3 of the prior art discussed in connection with FIGS. 1 and 2 of the patent drawing, creates heavy forces on the top and bottom ends of the perimeter causing uneven forces aimed towards the center portion Elastomeric pads 44 and 46 are easy to manufacture by extruding, and less costly to produce than the elastomeric pad of the prior art. The elastomeric pads 44 and 46 also allow a higher density of electric contacts in flexible printed circuit connections which in turn facilitates providing more input and output contact pads on a printed circuit board in comparison to the prior art electrical connector 1 discussed above.

The elastomeric pad of the invention eliminates the need for precise location and alignment, unlike the elastomeric pad 3 of the prior art which relies on direct positioning of ribs under each transverse row of electrical contacts during electrical connector assembly.

The elastomeric pad of the invention reduces connector interface resistance significantly and provides a uniform pattern of contact force distribution for bump or gold dot type contacts because the arcuate flexible printed circuit engaging surface flattens out when compressed causing even distribution of forces. In contrast the type elastomeric pad 3 of the prior art has a slight dish in each rib, which causes heavier forces in the outer regions and a lighter force located directly down the center region.

We claim:

1. A high-density electrical connector comprising:
   a rigid member having an array of electrical contact pads arranged in at least three rows with several electrical contact pads in each row,
   a clamp housing attached to the rigid member,
   a flexible printed circuit having a back surface, a front surface and a contact portion having an array of electrical contacts protruding outwardly of the front surface of the flexible printed circuit,
   the contact portion being disposed between the clamp housing and the rigid member,
   the array of protruding electrical contacts matching the array of electrical contact pads, and
   an elastomer contact pressure pad disposed between the clamp housing and the flexible printed circuit pressing each of the electrical contacts into one of the electrical contact pads,
   the elastomeric pad having an arcuate surface on one side engaging the back surface of the flexible printed circuit and at least three longitudinal ribs on an opposite side engaging the clamp housing, and
   the flexible printed circuit having a greater number of longitudinal rows of contacts than the number of longitudinal ribs.

2. The electrical connector as defined in claim 1 wherein the array of electrical contacts is an array of bump contacts.

3. The electrical connector as defined in claim 1 wherein the array of electrical contacts is an array of gold dot contacts.

4. A high-density electrical connector comprising:
   a rigid member having an elongate array of electrical contact pads arranged in several rows with several electrical contact pads in each row,
   an adjustable clamp housing attached to the rigid member,
   a flexible printed circuit including a flexible ribbon insulator having a back surface and a front surface,
   the flexible printed circuit including a contact portion having an elongate array of electrical contacts that protrude outwardly of the front surface of the flexible ribbon insulator,
   the contact portion being disposed between the clamp housing and the rigid member,
   the elongate array of electrical contacts matching the elongate array of electrical contact pads,
   an elongate elastomeric contact pressure pad disposed between the clamp housing and the contact portion of the flexible printed circuit pressing each of the electrical contacts into one of the electrical contact pads,
   the elongate elastomeric pad having an arcuate surface on one side engaging the back surface of the flexible insulator ribbon of the flexible printed circuit and at least three longitudinal ribs on an opposite side engaging the clamp housing,
   the flexible printed circuit having a number of longitudinal rows of contacts greater than the number of longitudinal ribs.

5. The high density electrical connector as defined in claim 4 wherein the elastomeric pad is resiliently deformed by the clamp housing to provide a substantially uniform contact pressure to the elongate array of electrical contacts.

6. The high density electrical connector as defined in claim 4 wherein the elongate array of electrical contact pads and the elongate array of electrical contacts are rank and file arrangements comprising a plurality of longitudinal rows of contacts each comprising a short lateral row of contacts.

7. A high-density electrical connector comprising:
   a rigid member having an elongate rank and file array of electrical contact pads arranged in several rows with several electrical contact pads in each row,
   an adjustable clamp housing attached to the rigid member,
   a flexible printed circuit including a flexible ribbon insulator having a back surface and a front surface,
   the flexible printed circuit including a contact portion having an elongate rank and file array of electrical contacts that protrude outwardly of the front surface of the flexible ribbon insulator,
   the contact portion being disposed between the clamp housing and the rigid member,
   the elongate array of electrical contacts matching the elongate array of electrical contact pads,
   an elongate elastomeric contact pressure pad disposed between the clamp housing and the contact portion of the flexible printed circuit pressing each of the electrical contacts into one of the electrical contact pads,
   the elongate elastomeric pad having an arcuate surface on one side engaging the back surface of the flexible insulator ribbon of the flexible printed circuit, and at least three longitudinal ribs on an opposite side engaging the clamp housing,
   the longitudinal ribs being substantially parallel and the arcuate side having an apex that is substantially parallel to the longitudinal ribs, and
   the flexible printed circuit having a number of longitudinal rows of contacts greater than the number of longitudinal ribs.

8. The high density electrical connector of claim 7 wherein the elastomeric pad is resiliently defomed by the clamp housing to provide a substantially uniform contact pressure to the elongate array of electrical contacts.

9. The high density electrical connector of claim 8 wherein the arcuate surface is flattened and the longitudinal ribs are flattened whereby the one side and the other side are substantially planar and parallel to each other.

* * * * *